United States Patent [19]
Kinoshita et al.

[11] Patent Number: 5,276,572
[45] Date of Patent: Jan. 4, 1994

[54] MAGNETIC DISK APPARATUS

[75] Inventors: Yoshihiko Kinoshita, Hiratsuka; Tatuya Ishigaki, Yokohama; Motohiro Nakai, Odawara, all of Japan

[73] Assignee: Hitachi, Ltd., Tokyo, Japan

[21] Appl. No.: 762,936

[22] Filed: Sep. 19, 1991

[30] Foreign Application Priority Data

Sep. 19, 1990 [JP] Japan .................. 2-247263

[51] Int. Cl.⁵ .............................. G11B 5/54
[52] U.S. Cl. .................................. 360/97.01
[58] Field of Search ............ 360/97.01, 97.02, 98.01, 360/105, 106, 75

[56] References Cited

U.S. PATENT DOCUMENTS 5,034,837 7/1991 Schmitz ................. 360/105
5,060,100 10/1991 Mihara et al. ........... 360/108

FOREIGN PATENT DOCUMENTS 283465 12/1987 Japan .

Primary Examiner—Carolyn E. Fields
Attorney, Agent, or Firm—Antonelli, Terry, Stout & Kraus

[57] ABSTRACT

An electric circuit for controlling a magnetic head is mounted on a flexible printed circuit (hereinafter referred to as "FPC"), and the FPC is arranged in a folded state within an enclosure. The FPC has an electronic circuit disposed on one side surface thereof, the one side surface being formed when the FPC is extended in a plane. Connectors are arranged on one end portion of the FPC for connecting to the magnetic head and external equipment. A support member is bonded to the surface of the FPC opposite to the surface mounting the electronic circuit, and by this supporting member the FPC is secured in a state folded in at least two within the housing of the magnetic disk apparatus.

22 Claims, 11 Drawing Sheets

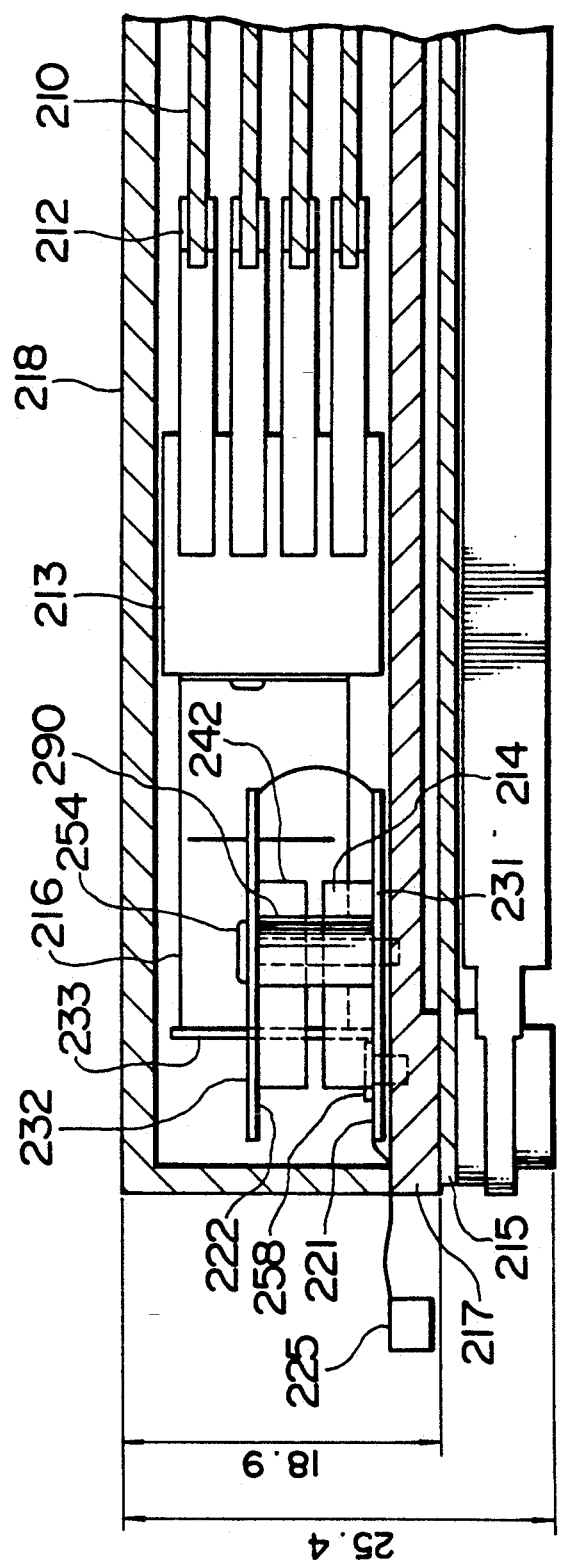

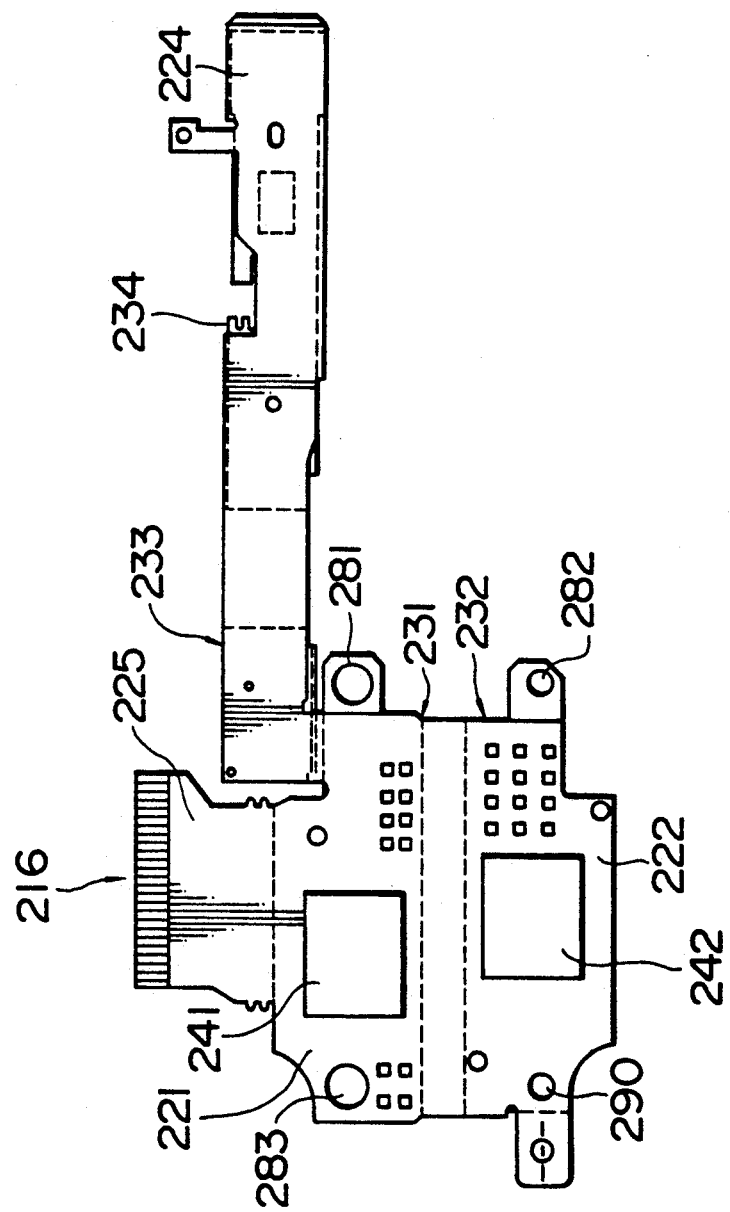

MAGNETIC DISK APPARATUS

BACKGROUND OF THE INVENTION

The present invention relates to a magnetic disk apparatus, and more particularly relates to a magnetic disk apparatus having an improved flexible printed circuit board incorporated into the housing thereof.

In magnetic disk apparatuses, reduction in size of the whole construction, and increase in storage capacity thereof have been rapidly achieved. A representative attempt to reduce magnetic disk apparatuses in size is disclosed in Japanese patent unexamined publication No. 62-283465, in which a flexible printed circuit board is mounted to a head arm, and a pre-amplifier is arranged on the flexible printed circuit board to be received in a recess in the head arm.

In magnetic disk apparatuses, an increase in storage capacity raises a problem in that the control of positioning of the magnetic head and mounting of the pre-amplifier become harder. An increase in storage capacity can be usually achieved by increasing the number of magnetic disks, but the increase of the number of magnetic disks in turn results in increases in number of both the magnetic heads and pre-amplifiers which amplify signals read by the magnetic heads. Particularly, conventional large scale integrated pre-amplifiers limit the number of magnetic heads, which perform signal processing, to six, for example. Accordingly, the number of pre-amplifiers must be increased as the number of magnetic disks and that of magnetic heads increase.

In the attempt of Japanese unexamined patent publication 62(1987)-283465, pre-amplifiers are mounted on head arms, and hence an increase in number of pre-amplifiers enlarges the moment of inertia of the head arms, so that the magnetic heads are deteriorated in accuracy of positioning. When the whole apparatus is reduced in size by down sizing the magnetic disks from 5 inches to 3.5 inches, the head arms also becomes small sized, and thus it becomes very difficult to mount pre-amplifiers to head arms.

SUMMARY OF THE INVENTION

Accordingly, it is an object of the present invention to provide a magnetic disk apparatus which is capable of realizing reduction in size thereof and an increase in storage capacity.

It is another object of the present invention to provide a magnetic disk apparatus which is capable of arranging electronic circuits at a high density with a fairly simple structure.

To achieve these and other objects, pre-amplifiers are mounted on a flexible printed circuit board (hereinafter referred to as "FPC"), and this FPC is disposed in a folded shape within the enclosure. When the FPC is extended in a plane, device regions are continuously located on one surface of the FPC. A connector region may be provided to one end of the FPC for connecting to the magnetic heads and external equipment. Pre-amplifiers to amplify signals read by magnetic heads, circuits to control signals which are recorded/reproduced by magnetic heads, and like components may be mounted to the device region. The connector region may be provided at its end portion with connector terminals if needed. The connector terminals may be connected to the device region through wiring arranged on the board.

A support member may be bonded to the opposite surface of the device region of the FPC, and this support member secures the FPC to the base in the folded shape. The FPC may be folded so that at least two device regions may face to each other, and may be disposed vertically or horizontally at an appropriate position within the housing. With such a construction, it is possible to fairly reduce the space occupied by the FPC even if many pre-amplifiers are mounted, and hence the remaining space within the magnetic disk apparatus may be effectively used for mounting other components.

BRIEF DESCRIPTION OF THE DRAWINGS

In the drawings:

FIG. 15 is a vertical cross-sectional view of parts around a FPC of a magnetic disk apparatus as a third embodiment of the present invention;

FIG. 16 is an extended view of the FPC of FIG. 15;

DESCRIPTION OF THE PREFERRED EMBODIMENT

Figure 1:
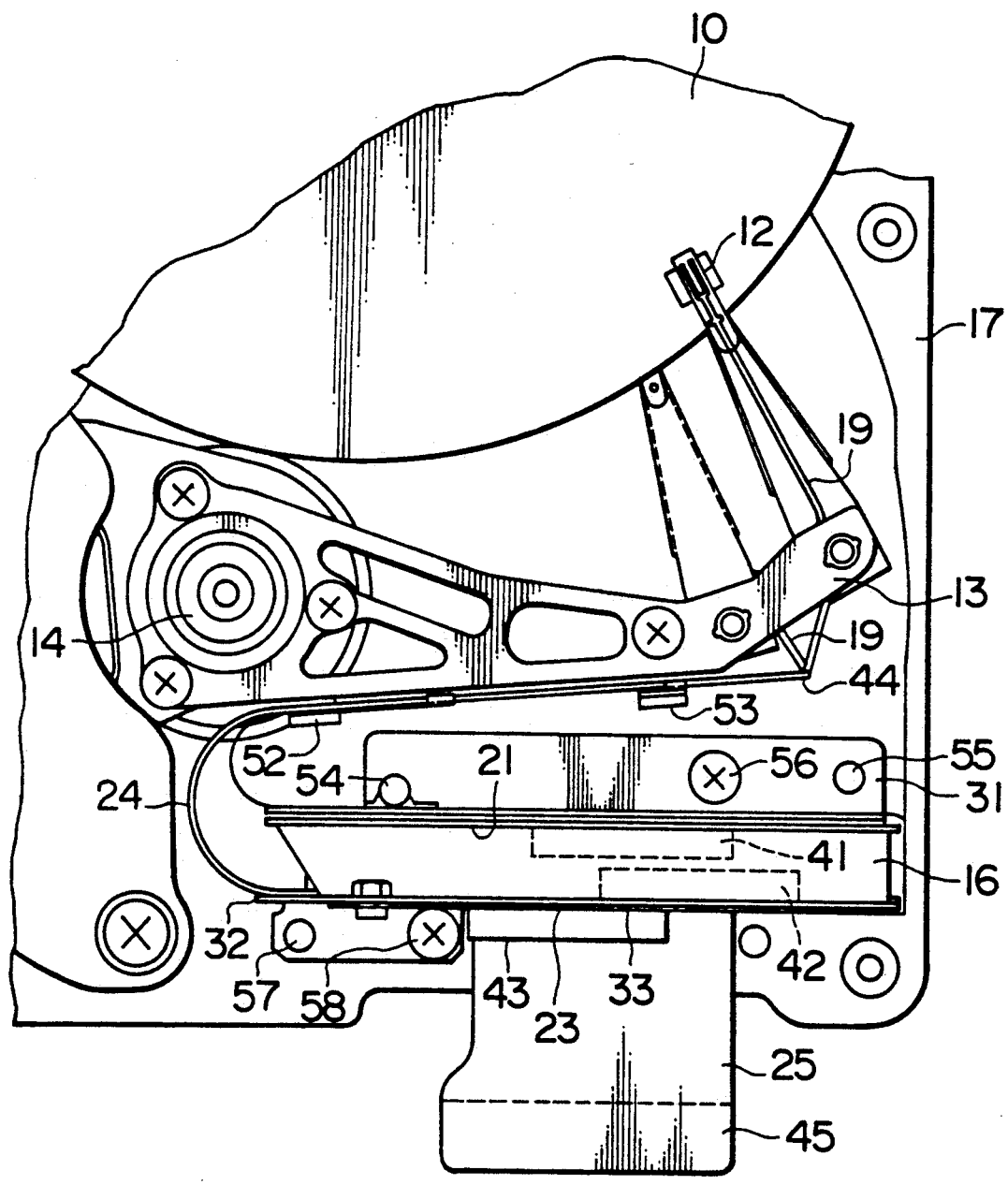
FIG. 1 is a plan view of an essential part of a magnetic disk apparatus as one embodiment of the present invention.
Figure 3:
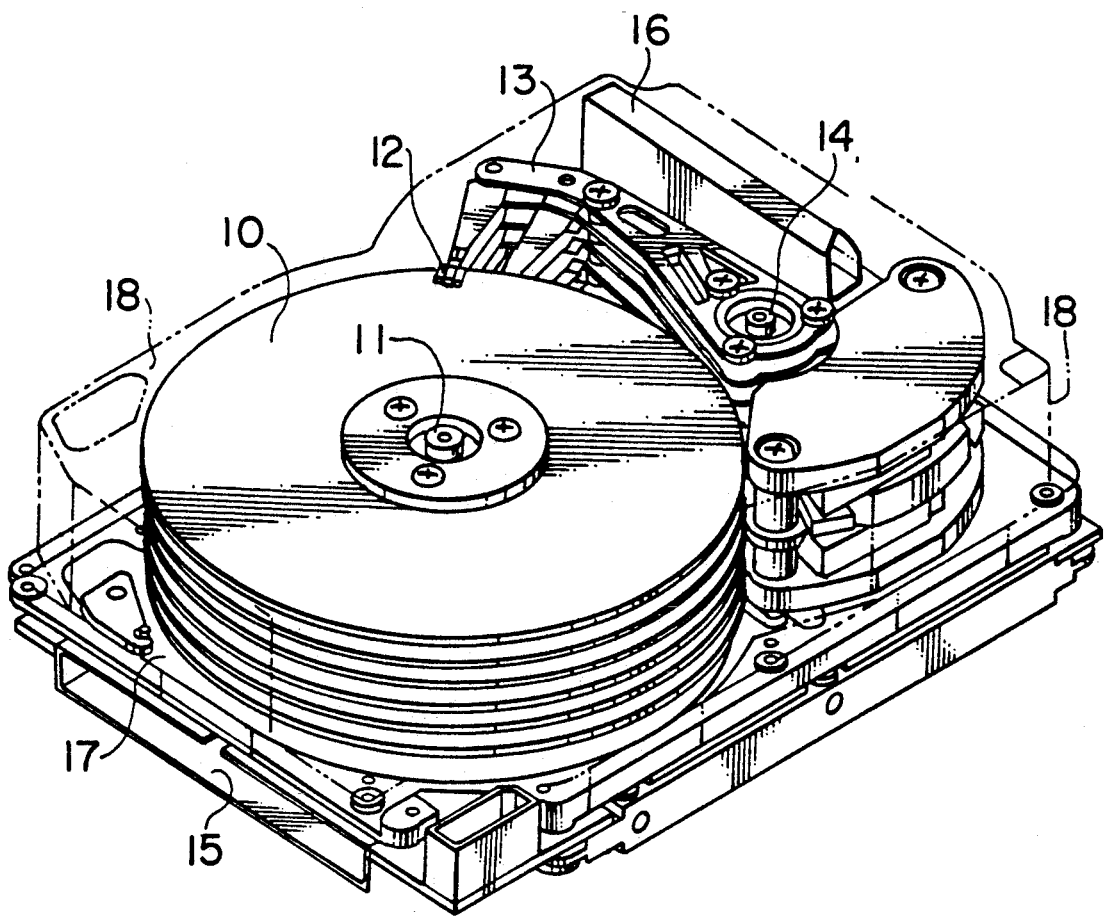
FIG. 3 is a perspective view, reduced in scale, showing the overall construction of the magnetic disk apparatus of FIG. 1.

A magnetic disk apparatus as one embodiment of the present invention will be described with reference to the accompanying drawings. FIG. 1 is a plan view illustrating an essential portion of the magnetic disk apparatus, and FIG. 3 is a perspective view of the overall structure thereof.

The magnetic disk apparatus is equipped with multiple magnetic disks 10 to store data, a spindle motor 11 to rotate the magnetic disks 10, magnetic heads 12 to read/write data, head arms 13 supporting respective magnetic heads 12, an actuator 14 to swing head arms 13, pre-amplifiers to amplify weak signals from the magnetic heads 12, and a FPC 16 to send signals to the control circuit board 15. The magnetic disk apparatus is further provided with a base 17, mounting these components, and a cover 18 for protecting the components from dust and noise. The base 17 and the cover 18 define a sealed housing. In this embodiment, the FPC 16 is fastened in a folded state to the base 17 close to one side of each of head arms 13. The magnetic heads 12 are connected to the FPC 16 through leads 19.

Figure 4:
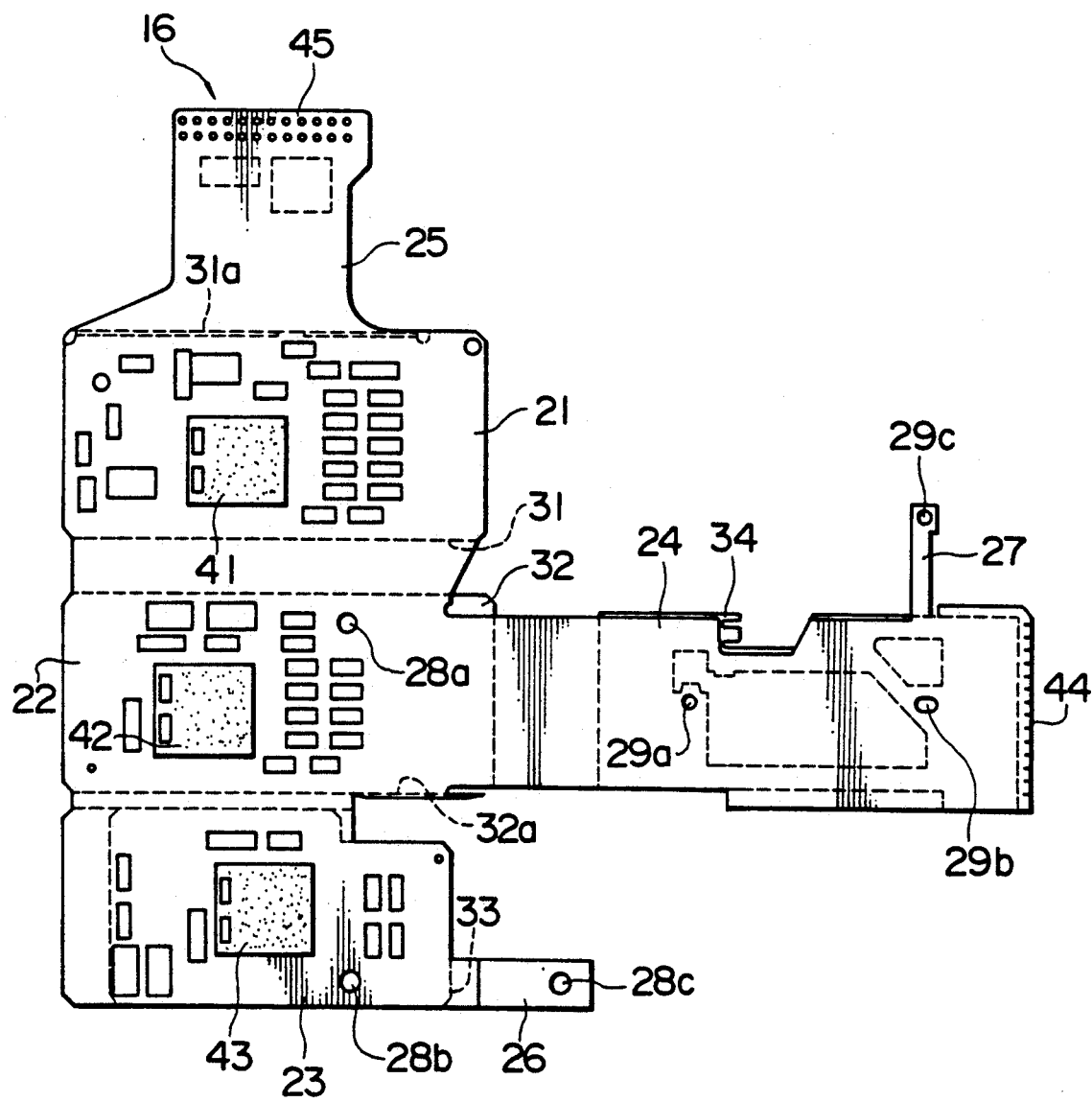
FIG. 4 is an extended view of the FPC of FIG. 1.

FIG. 4 illustrates the FPC 16 in an extended state. This FPC 16 is provided with three device regions 21, 22 and 23 and two connector regions 24 and 25. The device regions 21, 22 and 23 are provided with pre-amplifiers 41, 42 and 43 and related electronic devices, respectively. These regions are arranged in a column on the same plane of the FPC. The connector region 24 is disposed to a side periphery of the device region 22 whereas the connector region 25 is disposed at a side periphery of the device region 21. Furthermore, gland portions 26 and 27 are formed with a side periphery of the device region 23 and an upper periphery of the connector region 24, respectively. The device region 22, the device region 23 and the gland 26 are provided with respective fastening holes 28a–28c for fastening the FPC 16 to the base 17. The connector region 24 and the gland 27 have holes 29a–29c to fix them to head arms 13 when they are folded.

The device regions 21, 22 and 23 and the connector region 24 have support members 31, 32, 34 and 34 bonded to rear surfaces thereof, respectively. These support members 31, 32, 33, and 34 are spacedly bonded to the FPC 16 through an adhesive so that they may not come into contact with each other when the FPC 16 is folded and support and reinforce the FPC 16 at least in the area of the device regions.

Figure 5:
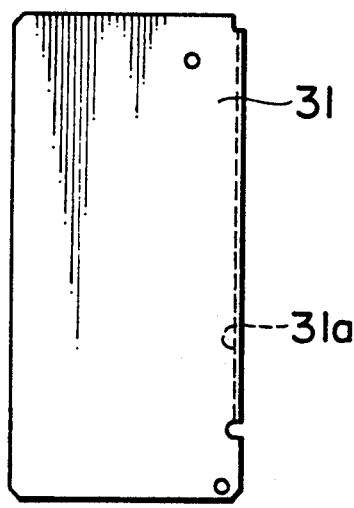
FIG. 5 is a plan view of one of the support members bonded to the FPC of FIG. 4.
Figure 6:
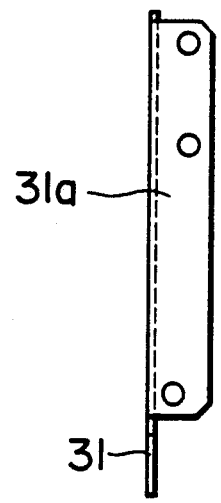
FIG. 6 is a side view of the support member in FIG. 5.
Figure 7:
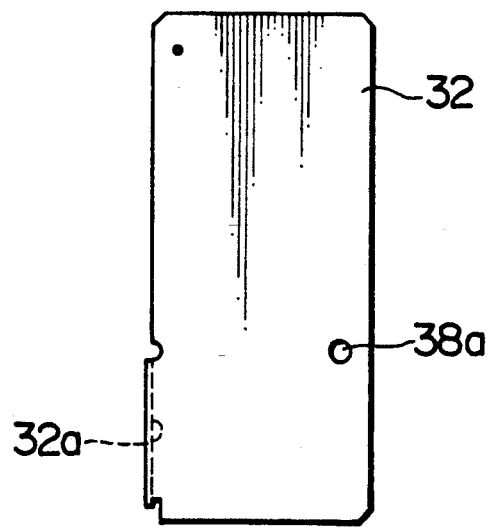
FIG. 7 is a plan view of another support member of FIG. 4.
Figure 8:
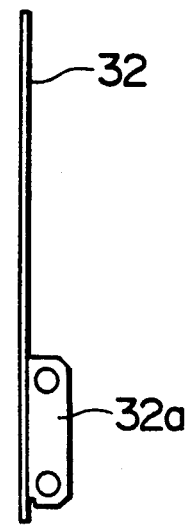
FIG. 8 is a side view of the support member in FIG. 7.
Figure 9:
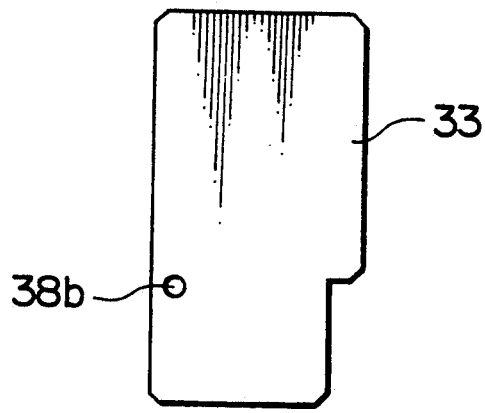
FIG. 9 is a plan view of a still another support member of FIG. 4.
Figure 10:
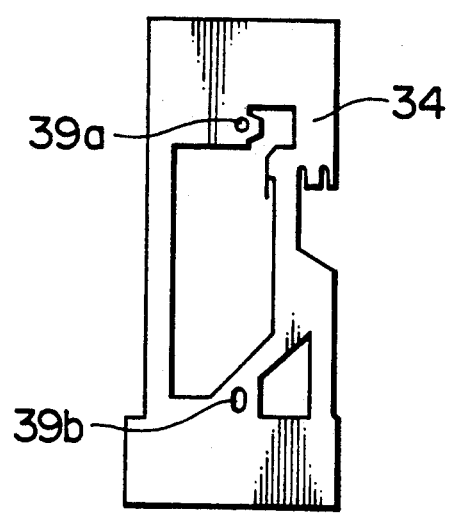
FIG. 10 is a plan view of another support member of FIG. 4.
Figure 11:
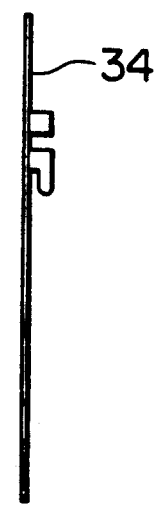
FIG. 11 is a side view of the support member of FIG. 10.

As shown in FIGS. 5 to 11, the support members 31, 32, 33 and 34 are made of a thin metallic plate, and have substantially the same shapes as corresponding device regions and connector regions. The support members 32 and 33 are provided with holes 38a and 38b, respectively. The hole 38a corresponds to the hole 28a of the device region 22 while the hole 38b the hole 28b of the device region 23. The support member 34 has holes 39a and 39b which correspond to holes 29a and 29b of the connector region 24, respectively. The support member 31 is, as illustrated in FIGS. 5 and 6, provided with a portion 31a bent vertically to the other portion thereof which is to be brought into contact with the device region 21. As shown in FIGS. 7 and 8, the support member 32 also has a portion 32a bent vertically to the other portion thereof which is to be placed into contact with the device region 22. These bent portions serve to fasten the FPC 16 to the base 17, and are provided with both through holes for engaging with fastening screws and through hole for engaging with positioning pins mounted on the base 17.

Returning to FIG. 4, the pre-amplifiers 41, 42 and 43 are mounted on the device regions 21, 22 and 23 together with related electronic devices, respectively. The related electronic devices are shown by rectangular boxes. The connectors 44 and 45 are provided at end portions of the connector regions 24 and 25 respectively. Wiring is arranged on the surface of the FPC 16 for sending signals from a connectors 44 to the connectors 45 through pre-amplifiers.

Figure 12:
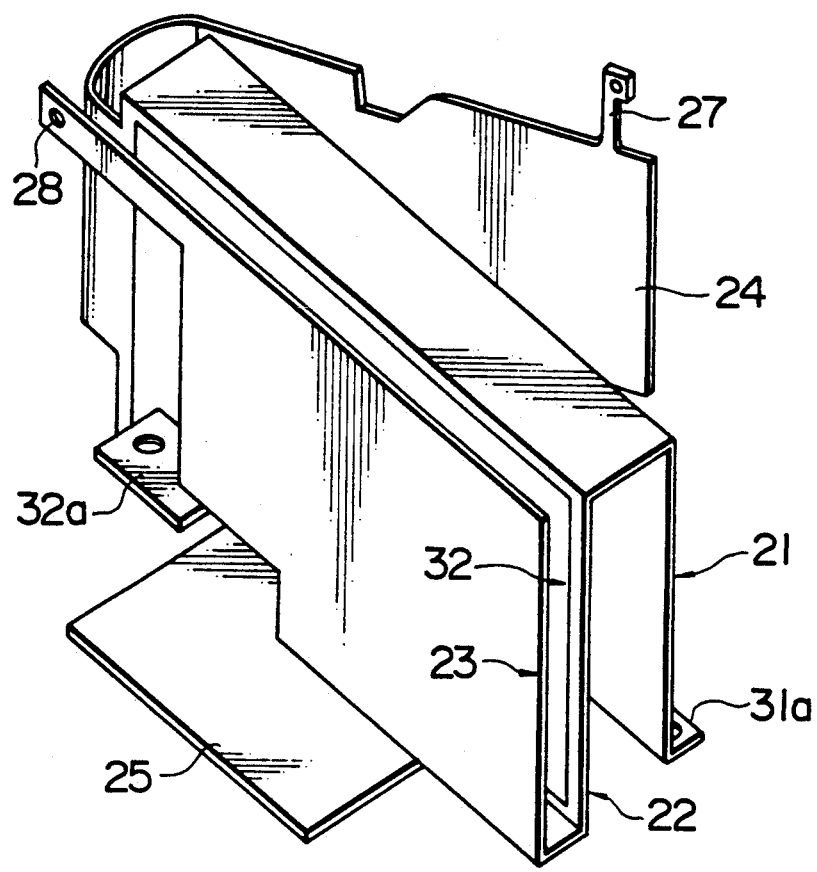
FIG. 12 is an illustration showing the FPC of FIG. 1 in a folded state.
Figure 13:
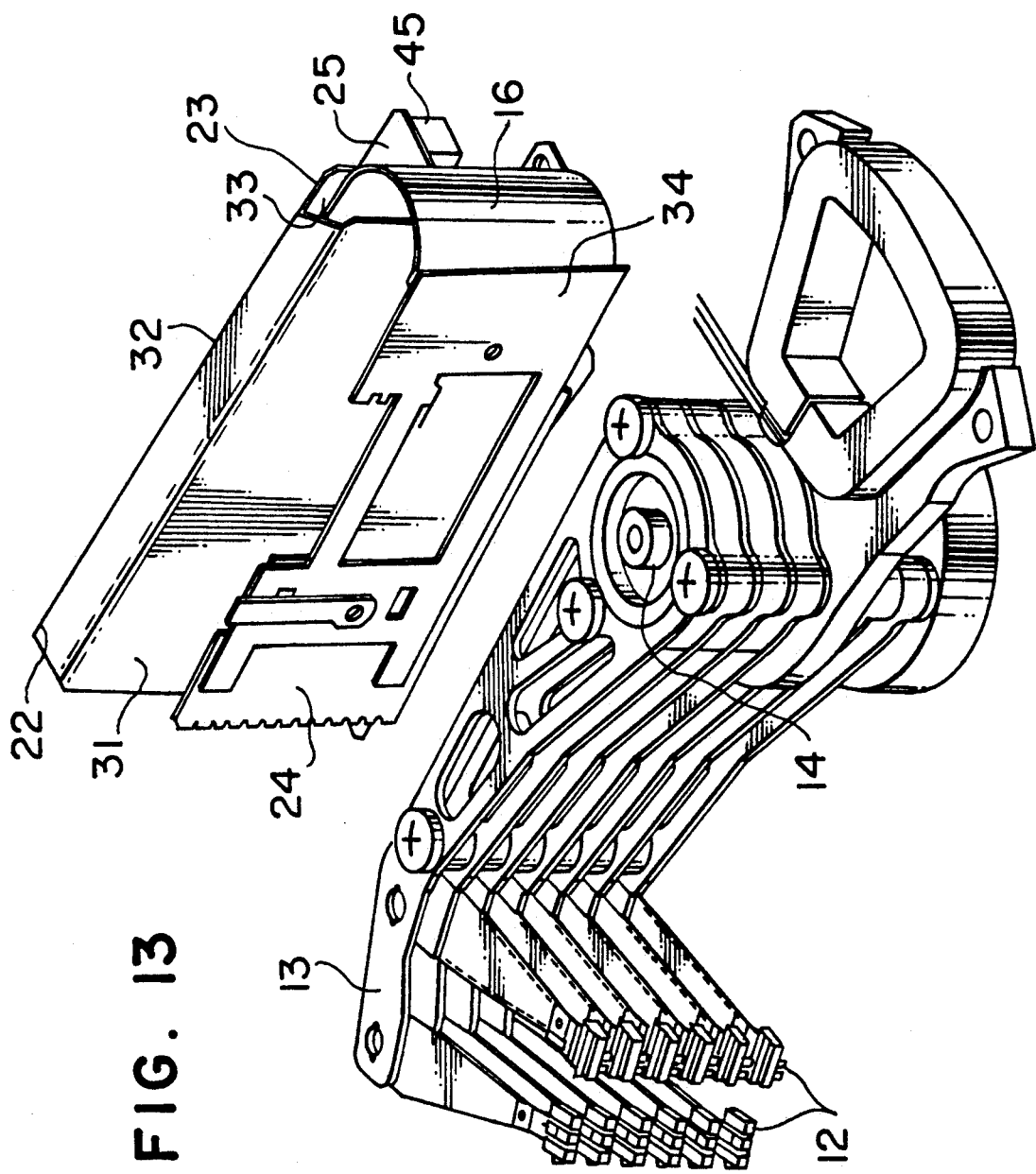
FIG. 13 is an illustration showing the FPC of FIG. 1 in a mounted state.

In FIG. 4, the FPC 16 is folded inwardly in a portion thereof between the support members 31 and 33 whereas the portion between the support members 32 and 33 is bent outwardly. Thus, FPC 16 is folded so that it has a S shape cross-section. Furthermore, the portion between the support members 32 and 34 is bent inwardly. The connector region 25 is inwardly bent at the boundary line between the device region 21 and it so that as shown in FIG. 12 it extends below the device regions 21 to 23, bent in the S-shape, to the outside of the device region 23. The gland 26 is inwardly bent to be disposed between the device regions 22 and 23, and is fastened together with the device regions 22 and 23 by a bolt 51 which pass through holes 28a, 28b and 28c. In the folded state, the pre-amplifiers 41 and 42 faces at upper surfaces thereof to each other, whereas the upper surfaces of the pre-amplifiers 42 and 43 face away from each other. FIGS. 12 and 13 illustrate the FPC 16 thus folded.

Figure 2:
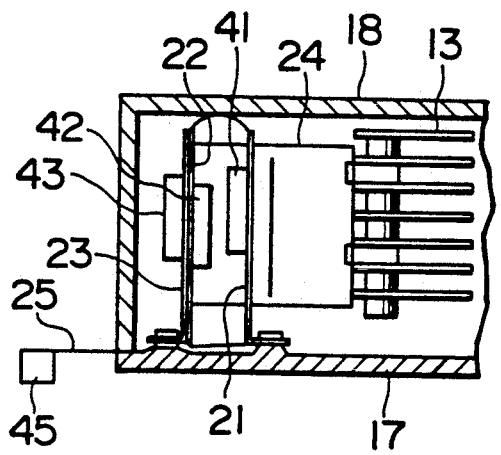
FIG. 2 is a vertical cross-sectional view, modified in scale, illustrating parts around the FPC of the magnetic disk apparatus of FIG. 1.

As illustrated in FIGS. 1, 2 and 13, the FPC 16 is secured so that the connector region 24 faces to one side of each of the head arms 13 for connection to wires extending from magnetic heads 12. This securing of the FPC 16 is performed by fastening the FPC 16 to the head arms 13 through bolts 52 and 53. The bolt 52 passes through the hole 29a of the connector region 24 and the hole 39a of the support member 34 while the bolt 53 the hole 29b of the connector region 24 and the hole 39b of the support member 34. In this event, the gland 27 is bent over the head arms 13 so that the hole 29c is registered to the hole 29b, and the gland 27 is secured to the head arm 13 through the bolt 53.

The bent portion 31a of the support member 31 which is placed on the rear surface of the device region 21 is fitted around the positioning pins 54 and 55, and is fastened to the base 17 through a bolt 56. On the other hand, the bent portion 32a of the support member 32 which is located on the rear surface of the device region 22 is fitted around a positioning pin 57 on the base 17, and is secured to the base 17 through a bolt 58. The FPC is maintained in the folded state by securing support members 31 and 32 to the base in this manner. A free end of the connector region 25 folded extends below the device region 23 so that the connectors 45 are connected to connectors of a control circuit board 15 disposed on the lower surface of the base 17.

In the magnetic disk apparatus of the present invention, electronic devices such as pre-amplifiers 41 to 43 may be mounted on one surface of the FPC 16, and hence it is possible to automatically mount many electronic devices by a mounting machine with ease. Furthermore, the FPC 16 is secured to the base 17 in a folded state, and hence the space occupied by it may be reduced as small as possible even if many electronic devices are mounted on it. This enables the whole apparatus to be made fairly compact. No pre-amplifiers are mounted on the head arms 13, and hence the head arms 13 are reduced in moment of inertia, so that the magnetic heads 12 are positioned at a high accuracy.

Figure 14:
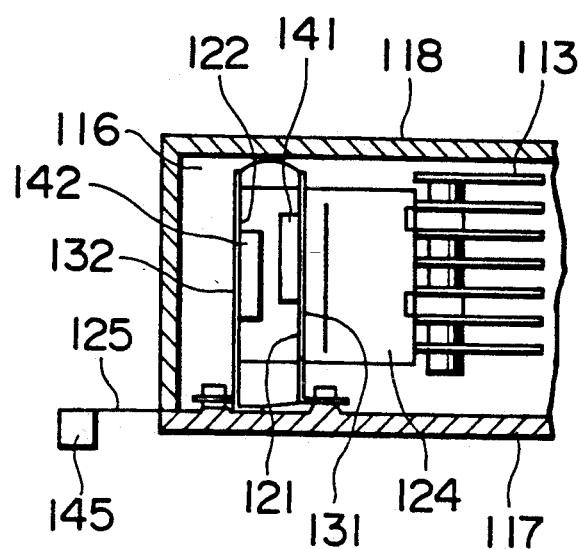
FIG. 14 is a vertical cross-sectional view of parts around a FPC of a magnetic disk apparatus as a second embodiment of the present invention.

FIG. 14 illustrates a magnetic disk apparatus as a second embodiment of the present invention. This embodiment is distinct from the first embodiment in both the shape and the fastening manner of the FPC. In FIG.

14, parts corresponding to parts of FPC 16 of the first embodiment are designated by three figure numerals of which the least two figures are the same as reference numerals of corresponding parts of the first embodiment. An FPC 116 of this embodiment has two device regions 121 and 122 and two connector regions 124 and 125.

Device regions 121 and 122 are disposed in a column on the same surface of the FPC 116. The connector region 124 has connectors mounted on it for connection to magnetic heads, and is provided to one side periphery of the device region 122. A connector region 125 is provided with a connector 145 for connection to a control circuit substrate located on the lower surface of the base 117. The connector region is arranged to face the connection portion between the device region 121 and the device region 122. Support members 131 and 132 are bonded to rear surfaces of the device regions 121 and 122, respectively. Preamplifiers 141 and 142 are mounted corresponding device regions 121 and 122 together with related electronic devices. The FPC 116 is folded as follows: the portion between the device regions 121 and 122 is inwardly folded to face preamplifiers 141 and 142 to each other; the portion between the connector region 124 and the device region 122 is inwardly folded; and the portion between the connector region 125 and the device region 122 is inwardly folded and is secured by bending it to extend below the device region 132 folded.

A third embodiment of the present invention in which a FPC is horizontally arranged is illustrated with reference to FIGS. 15 to 21. In this embodiment, the present invention is applied to a magnetic disk apparatus 1 inch (25.4 mm) high and having a 3.5 inch disk. In such a thin apparatus, it is not possible to arrange device regions vertically to bases 17 and 117 as in the first and second embodiments. In this embodiment, a FPC 216 is arranged on a base 217 on one side of head arms 213 so that device regions 221 and 222 of a FPC 216 are placed in a folded state in parallel with the base 217.

FIG. 16 shows the FPC 216 extended. The FPC 216 is provided with two device regions 221 and 222 and two connector regions 224 and 225. The device regions 221 and 222 are each provided with a pre-amplifier and related electronic devices. These regions 221 and 222 are arranged in a column on the same plane of the FPC 216. The connector region 224 is formed to extend from part of the device region 221. The connector region 225 is disposed at one side periphery of the device region 221. The device regions 221 and 222 are provided with respective holes 283 and 290 for passing screws to fasten the FPC 216.

Figure 18:
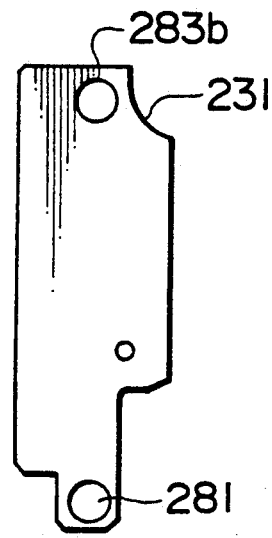
FIG. 18 is a plan view of the support member of FIG. 15.
Figure 20:
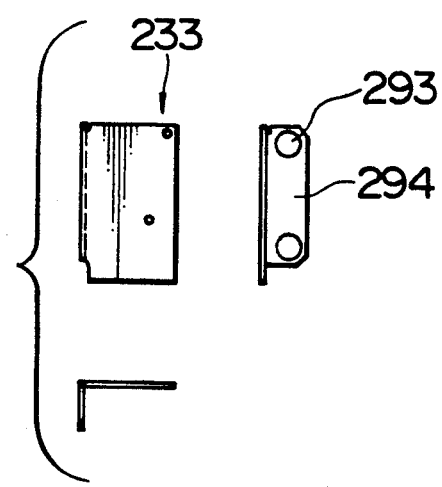
FIG. 20 shows front and side views of still another support member of FIG. 15.
Figure 19:
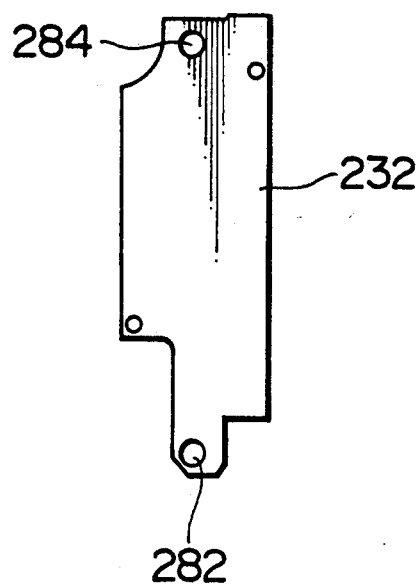
FIG. 19 is a plan view of another support member of FIG. 15.
Figure 21:
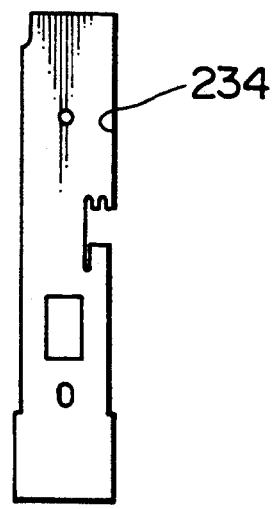
FIG. 21 is a plan view of another support member of FIG. 15.

Support members 231 and 232 are secured to rear surfaces of the device regions 221 and 222, respectively. The shapes of the support members 231 and 232 are shown in FIGS. 18 and 19. The support member 231 has a through hole 283b, which corresponds to holes 281 and 283, while the support member 232 is provided with a through hole 284 which corresponds to holes 282 and 290. Each of the support members 231 and 232 is made of a planar thin metal plate. The connector region 224 has support members 233 and 234 secured to the rear surface thereof. The support member 233 has a bent portion 294, which is provided with through holes 293 for fastening the FPC 216 to the base 217 through screws. These support members 231, 232, 233 and 234 are spacedly bonded through an adhesive so that they may not come into contact with or interfere with each other when the FPC 216 is folded.

Figure 17:
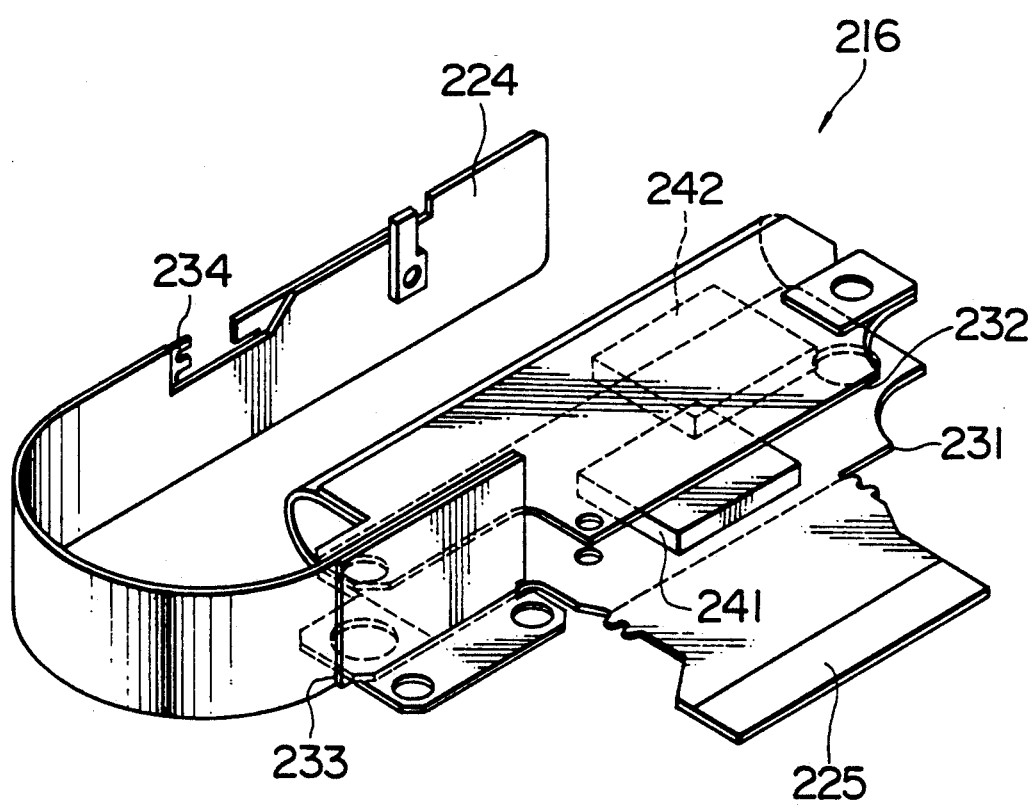
FIG. 17 is an illustration of the FPC of FIG. 15 in a folded state.

FIG. 17 shows the FPC folded substantially in a U shape in the following manner: the portion between the support members 231 and 232 is inwardly folded; and the portion between the support members 231 and 233 is inwardly folded. In the folded state, pre-amplifiers 241 and 242 face in upper surfaces thereof to each other.

FIG. 15 illustrates a state in which the FPC is practically mounted to the magnetic disk apparatus. The FPC 216 is fastened to the base 217 through screws 258 through holes 293 of the support member 233. The FPC 216 is also secured to the base 217 through electrically conductive collars 290 and screws 254. The electrically conductive collars 290 are provided at positions which correspond to positions of the holes 283 and 290 and the holes 281 and 282.

Although in the third embodiment, the FPC 216 is folded in two so that the device regions are in parallel to the base 217, FPC 216 folded in three may be disposed in parallel with the base 217. In this construction, a high density packaging of 1 inch height 3.5 inch magnetic disk apparatus and 2.5 inch magnetic disk apparatus can be achieved.

In the foregoing embodiments, description is given in cases where two or three device regions are provided, but the number of device regions may be increased on the basis of the embodiments. When four device regions, for example, are needed, an additional device region is continuously formed with the device region 23 of FIG. 5, and the device regions are folded so that the FPC is folded in a M shape. Furthermore, in the preceding embodiments only a pre-amplifier and related electronic devices are arranged in each of the device regions, but a circuit for performing read/write control of signals to be written in a magnetic disk and a circuit for controlling rotation of a spindle motor may be mounted on the FPC. This enables circuits, which are to be mounted on the control circuit board 15, to be mounted within the sealed housing.

What is claimed is:

1. A magnetic disk apparatus comprising:
   a magnetic head for reading information from and writing information in a magnetic disk;
   a head arm for holding the magnetic head;
   drive means for driving the head arm;
   at least one electric circuit for amplifying signals read by the magnetic head;
   a housing accommodating at least the magnetic head, the head arm, the drive means and the at least one electric circuit;
   a flexible printed circuit board for mounting the at least one electric circuit, the flexible printed circuit board having one surface mounting the at least one electric circuit thereon; and
   at least one support member for reinforcing the flexible printed circuit board in a region of the at least one electric circuit mounted thereon and securing the flexible printed circuit board to the housing, the at least one support member securing the flexible printed circuit board in a state folded in at least two within the housing.

2. A magnetic disk apparatus as recited in claim 1, wherein the flexible printed circuit board comprises:
   at least two device mounting regions;
   a first region for forming a connector to transmit signals from the magnetic head to the at least one electric circuit; and a second region for forming another connector for transmitting signals from the at least one electric circuit to a control circuit, and wherein the at least one electric circuit includes an upper surface and a lower surface and is mounted at the lower surface thereof on the device mounting regions.

3. A magnetic disk apparatus as recited in claim 2, wherein the device mounting regions are three in number, and wherein the flexible printed circuit board is folded so that at least one electric circuit mounted on two device mounting regions to face the upper surface to itself.

4. A magnetic disk apparatus as recited in claim 3, wherein the flexible printed circuit board is secured so that the device mounting regions are in parallel with the magnetic disk.

5. A magnetic disk apparatus as recited in claim 3, wherein the flexible printed circuit board is secured so that the device mounting regions are vertical to the magnetic disk.

6. A magnetic disk apparatus according to claim 1, wherein the flexible printed circuit board has connecting-regions at opposite ends thereof, one end connecting-region being connected with the magnetic head and the other end connecting-region being connected with at least one external device.

7. A magnetic disk apparatus according to claim 1, wherein the at least one support member is a metal plate member, the metal plate member being secured to the flexible printed circuit board on a surface of the flexible printed circuit board opposite the one surface mounting the at least one electric circuit thereon.

8. A magnetic disk apparatus according to claim 7, wherein the at least one electric circuit includes a plurality of devices, the plurality of devices being mounted at spaced positions along the one surface of the flexible printed circuit board, and a plurality of support members are provided and secured to the flexible printed circuit board at a surface of the flexible printed circuit board opposite the one surface having the devices mounted thereon.

9. A magnetic disk apparatus according to claim 8, wherein each of the plurality of support members is a metallic plate spaced from one another so as to not contact one another at least in the folded state of the flexible printed circuit board.

10. A magnetic disk apparatus comprising:
a magnetic head for reading information from and writing information in a magnetic disk;
a head arm for holding the magnetic head;
drive means for driving the head arm;
an electric circuit for amplifying signals read by the magnetic head;
a housing accommodating the magnetic head, the head arm, the drive means and the electric circuit;
a flexible printed circuit board for mounting the electric circuit, the flexible printed circuit board having one surface mounting the electric circuit thereon; and
a support member for securing the flexible printed circuit board to the housing, the support member securing the flexible printed circuit board in a state folded in at least two within the housing;
wherein the flexible printed circuit board includes:
at least two device mounting regions;
a first region for forming a connector to transmit signals from the magnetic head to the electric circuit; and a second region for forming another connector for transmitting signals from the electric circuit to a control circuit; and
wherein the electric circuit includes an upper surface and a lower surface and is mounted at the lower surface thereof on the device mounting regions and the flexible printed circuit board is folded so that the electric circuit is mounted to face the upper surface to itself.

11. A magnetic disk apparatus as recited in claim 10, wherein the flexible printed circuit board is secured so that the device mounting regions are in parallel with the magnetic disk.

12. A magnetic disk apparatus as recited in claim 10, wherein the flexible printed circuit board is secured so that the device mounting regions are vertical to the magnetic disk.

13. A magnetic disk apparatus comprising:
a magnetic head for reading information from and writing information in a magnetic disk;
a head arm for holding the magnetic head;
drive means for driving the head arm;
an electric circuit for amplifying signals read by the magnetic head;
a housing accommodating the magnetic head, the head arm, the drive means and the electric circuit;
a flexible printed circuit board for mounting the electric circuit, the flexible printed circuit board having one surface mounting the electric circuit thereon; and
support member for securing the flexible printed circuit board to the housing, the support member securing the flexible printed circuit board in a state folded in at least two within the housing;
wherein the flexible printed circuit board includes:
at least two device mounting regions;
wherein the support member comprises a plate member;
wherein the flexible printed circuit board includes a first surface and a second surface opposite to the first surface, the electric circuit being mounted on the second surface; and
wherein the support member is bonded to the first surface.

14. A magnetic disk apparatus comprising:
a transducer for reading information from and writing in a magnetic disk;
head arm means for holding the transducer;
drive means for driving the head arm means;
circuit means for controlling signals read by the transducer;
housing means for accommodating at least the transducer, the head arm means, the drive means, and the circuit means;
flexible circuit board means for mounting the circuit means thereon; and
support means for reinforcing the flexible circuit board means, in a region of the circuit means mounted thereon and for securing the flexible circuit board means in a state folded in at least two within the housing means.

15. A magnetic disk apparatus as recited in claim 14, wherein the circuit means comprises an amplification circuit for amplifying signals read by the transducer means.

16. A magnetic disk apparatus as recited in claim 14, wherein the circuit means comprises a demodulation circuit for demodulating signals read by the transducer means.

17. A magnetic disk apparatus as recited in claim 14, wherein the flexible circuit board means includes a surface having the circuit means mounted thereon, and wherein the circuit board means is secured so that the circuit means mounting surface is placed in parallel with the magnetic disk.

18. A magnetic disk apparatus as recited in claim 14, wherein the flexible circuit board means includes a surface having the circuit means mounted thereon, and wherein the circuit board means is secured so that the circuit means mounting surface is placed vertical to the magnetic disk.

19. A magnetic disk apparatus according to claim 14, wherein the flexible printed circuit board means has connecting-regions at opposite ends thereof, one end connecting-region being connected with the transducer and the other end connecting-region being connected with at least on external device.

20. A magnetic disk apparatus according to claim 14, wherein the support means includes a metal plate member, the metal plate member being secured to the flexible printed circuit board means on a surface of the flexible printed circuit board means opposite a surface mounting the circuit means thereon.

21. A magnetic disk apparatus according to claim 20, wherein the circuit means includes a plurality of devices, the plurality of devices being mounted at spaced positions along one surface of the flexible printed circuit board means, and a plurality of metal plates are provided and secured to the flexible printed circuit board means at a surface of the flexible printed circuit board means opposite the one surface having the devices mounted thereon.

22. A magnetic disk apparatus according to claim 21, wherein the plurality of metallic plates are spaced from one another so as to not contact one another at least in the folded state of the flexible printed circuit board.

* * * * *